(12) United States Patent
Kunz et al.

(10) Patent No.: US 11,355,211 B2
(45) Date of Patent: Jun. 7, 2022

(54) LOW QUIESCENT CURRENT LINEAR REGULATOR WITH MODE SELECTION BASED ON LOAD CURRENT AND FAST TRANSIENT DETECTION

(71) Applicant: TEXAS INSTRUMENTS INCORPORATED, Dallas, TX (US)

(72) Inventors: Keith Edmund Kunz, Tucson, AZ (US); Joseph Alan Sankman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/810,560

(22) Filed: Mar. 5, 2020

(65) Prior Publication Data

US 2020/0285262 A1    Sep. 10, 2020

Related U.S. Application Data

(60) Provisional application No. 62/814,122, filed on Mar. 5, 2019, provisional application No. 62/814,115, filed on Mar. 5, 2019.

(51) Int. Cl.
| | |
|---|---|
| *G05F 1/46* | (2006.01) |
| *G11C 27/02* | (2006.01) |
| *G05F 3/26* | (2006.01) |
| *G01R 19/165* | (2006.01) |
| *H03K 5/24* | (2006.01) |
| *H03K 19/21* | (2006.01) |
| *G05F 1/575* | (2006.01) |
| *G05F 1/613* | (2006.01) |

(52) U.S. Cl.
CPC ...... *G11C 27/026* (2013.01); *G01R 19/16552* (2013.01); *G05F 1/468* (2013.01); *G05F 1/575* (2013.01); *G05F 1/613* (2013.01); *G05F 3/262* (2013.01); *H03K 5/24* (2013.01); *H03K 19/21* (2013.01)

(58) Field of Classification Search
None
See application file for complete search history.

(56) References Cited

U.S. PATENT DOCUMENTS 5,717,319 A * 2/1998 Jokinen ............... G05F 1/577
                                                323/269
6,969,981 B1 * 11/2005 Fairbanks ............ H02M 3/28
                                                323/299

(Continued)

*Primary Examiner* — Thomas J. Hiltunen
(74) *Attorney, Agent, or Firm* — Mark A. Valetti; Charles A. Brill; Frank D. Cimino

(57) ABSTRACT

A system includes an input voltage source, a linear regulator coupled to the input voltage source, and a load coupled to an output of the linear regulator. The linear regulator includes an error amplifier coupled to a control terminal of a switch; and a control circuit coupled to the error amplifier and configured to provide a reference voltage to the error amplifier. The control circuit includes a mode selection circuit with a slow loop configured to sample a load current and with a fast loop configured to detect an output voltage error signal. The mode selection circuit is configured to adjust a mode of the control circuit between a continuous power mode and a duty cycle power save mode based on the sampled load current and the output voltage error signal.

20 Claims, 12 Drawing Sheets

(56) References Cited

U.S. PATENT DOCUMENTS

| | | | |
|---|---|---|---|
| 7,205,829 B2* | 4/2007 | Herbert | G11C 7/22 |
| | | | 327/294 |
| 8,330,532 B2* | 12/2012 | Nikolov | G05F 3/20 |
| | | | 327/540 |
| 9,285,434 B2* | 3/2016 | Lin | H02J 9/061 |
| 10,488,875 B1* | 11/2019 | Olieman | G05F 1/461 |
| 10,775,818 B2* | 9/2020 | Tiedemann | H02H 9/04 |
| 10,803,968 B2* | 10/2020 | Kunz | G01R 19/16552 |
| 2011/0032027 A1* | 2/2011 | Dash | G05F 1/56 |
| | | | 327/539 |
| 2021/0026384 A1* | 1/2021 | Jin | G05F 1/59 |
| 2021/0067028 A1* | 3/2021 | Li | H02M 3/157 |

\* cited by examiner

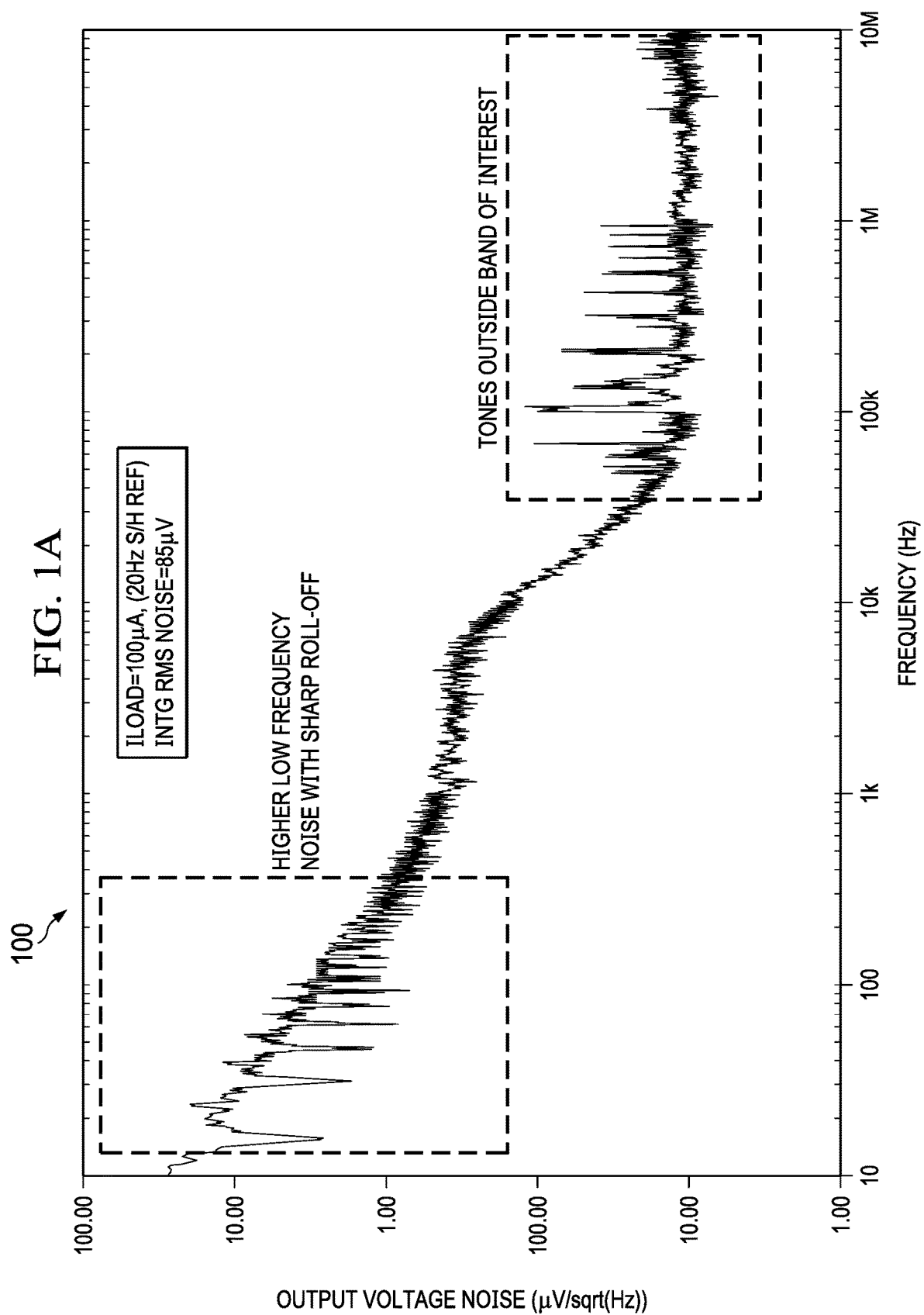

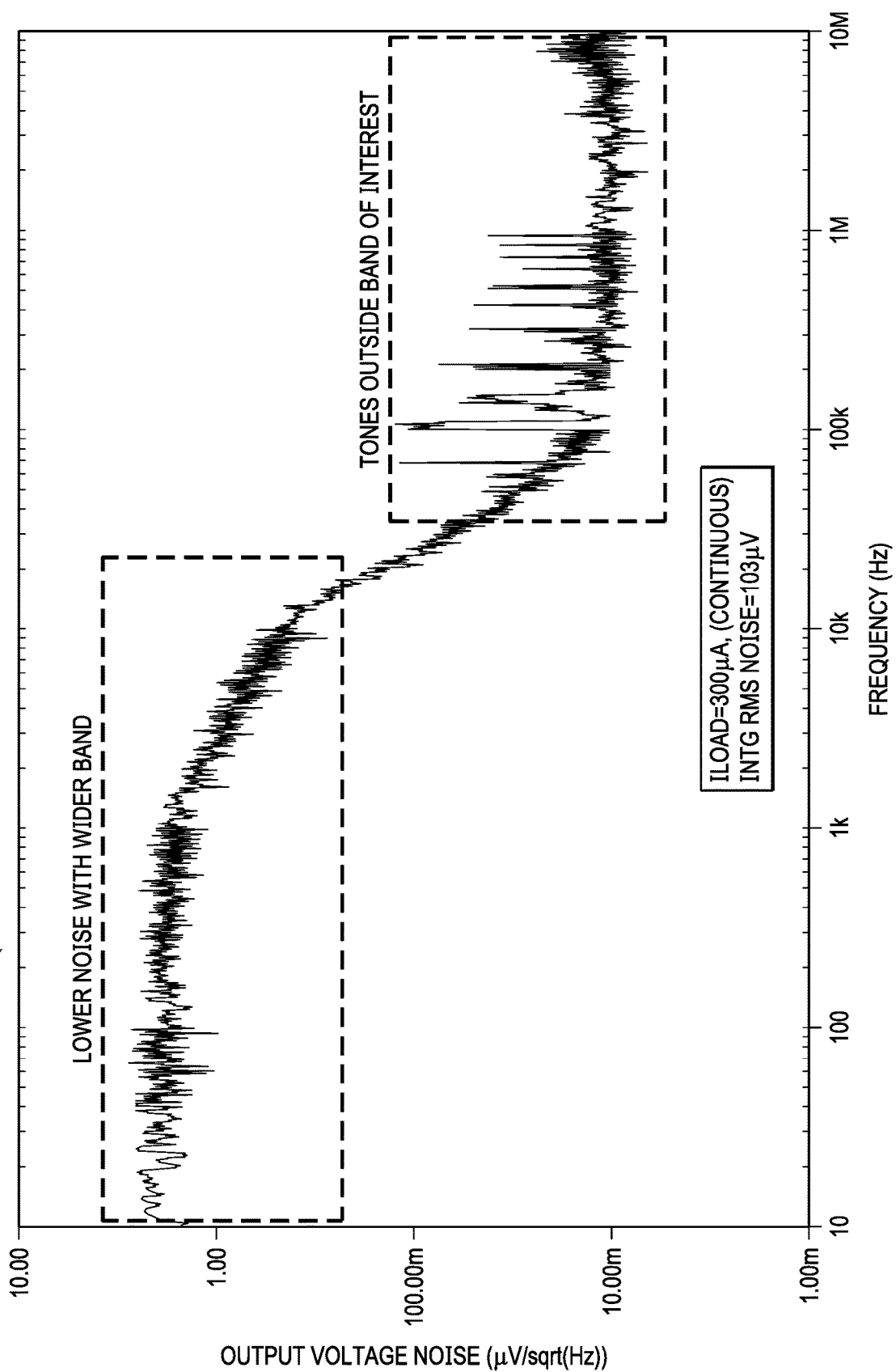

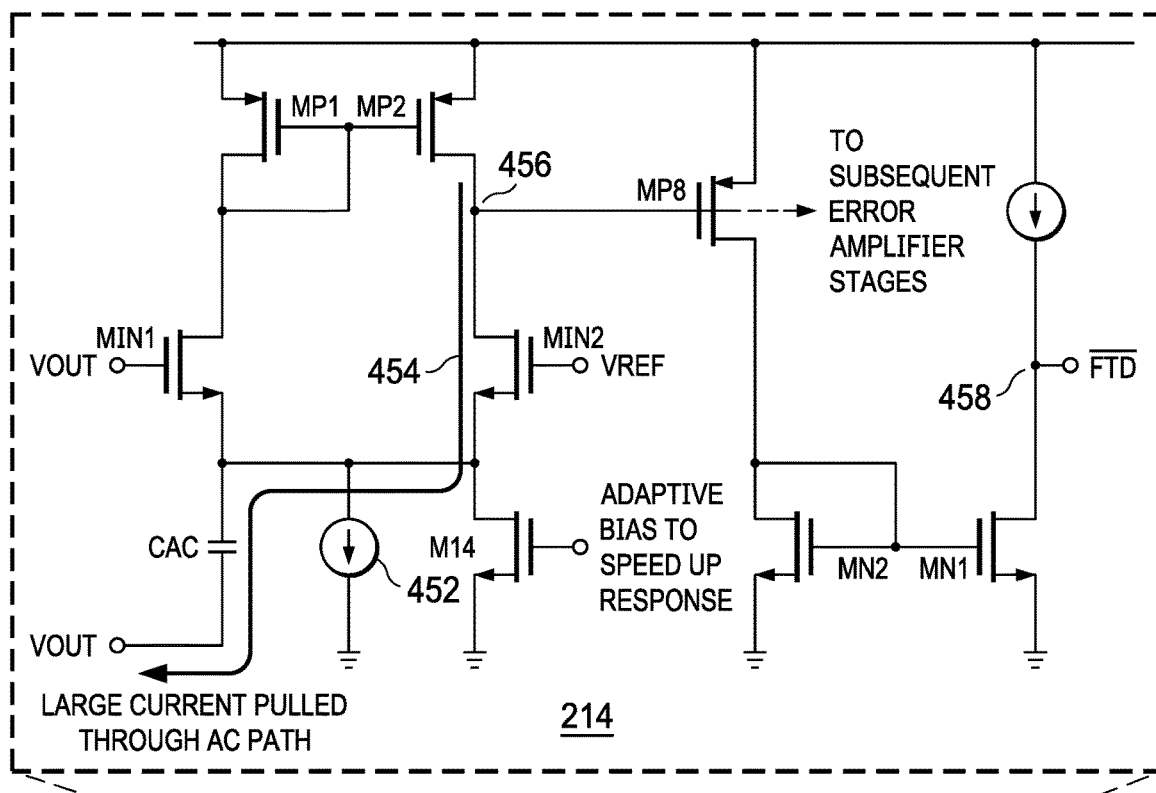
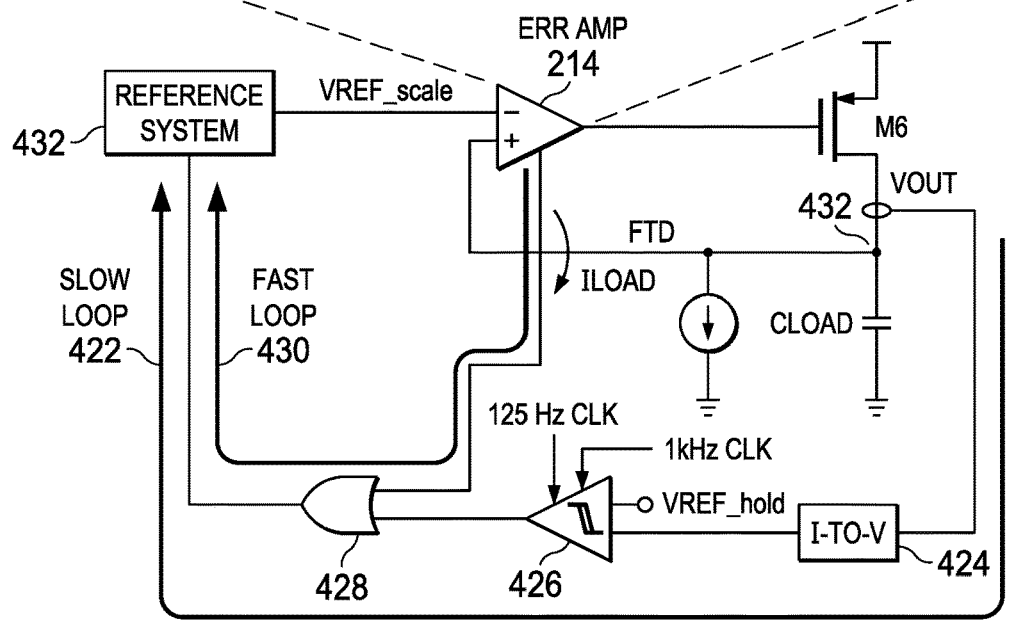
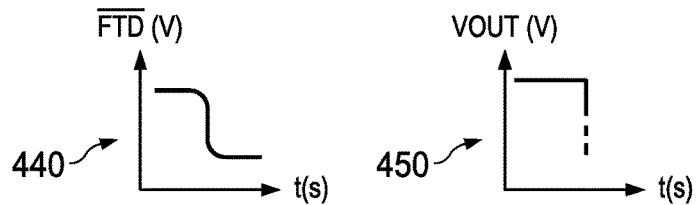
FIG. 4B

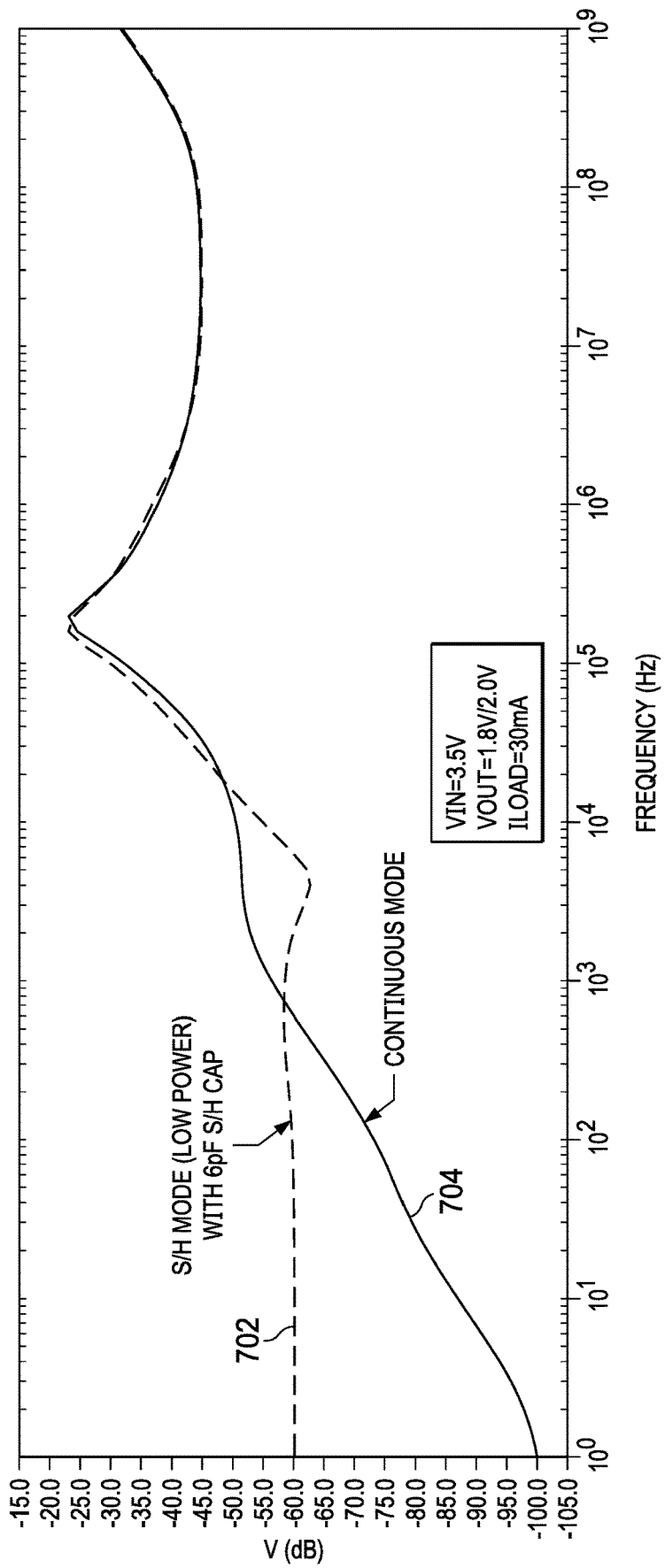

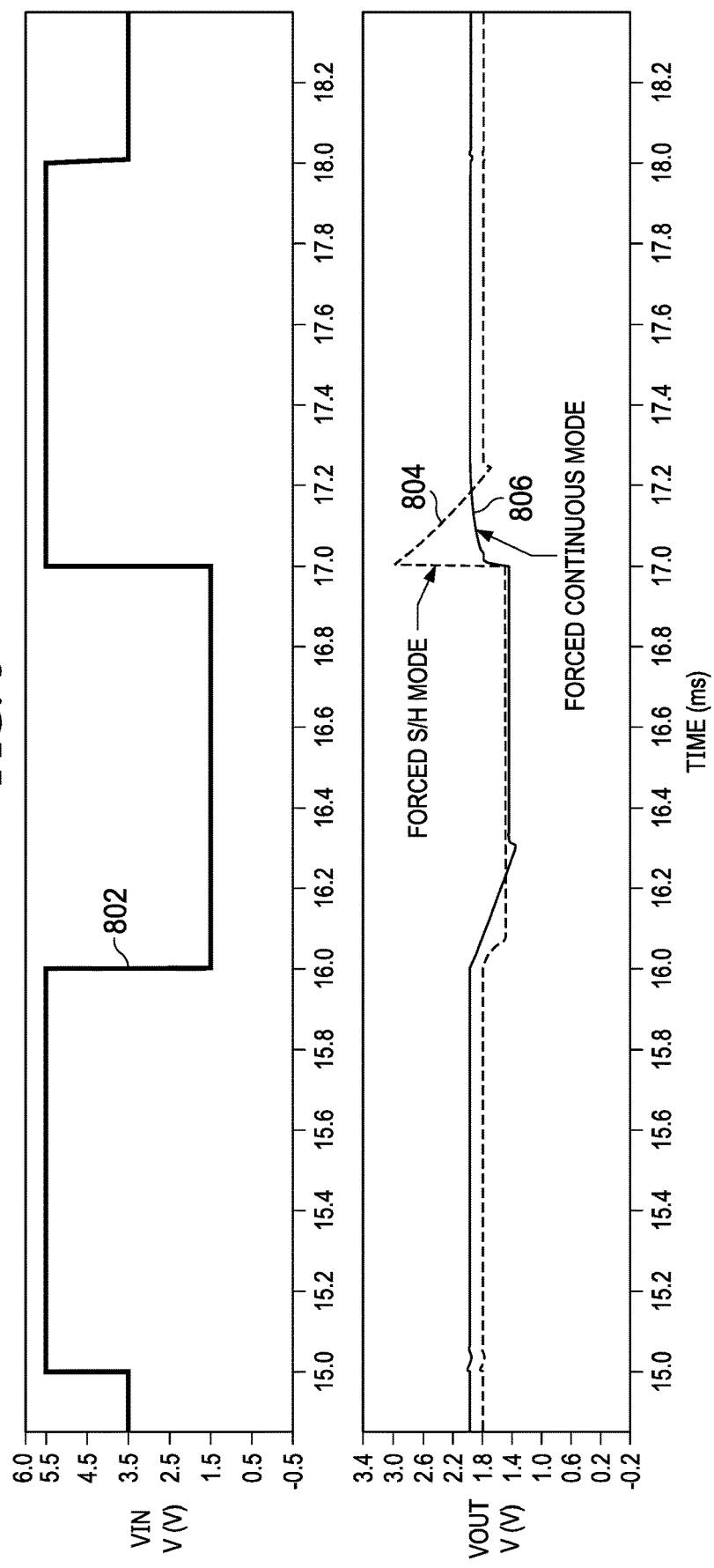

LOW QUIESCENT CURRENT LINEAR REGULATOR WITH MODE SELECTION BASED ON LOAD CURRENT AND FAST TRANSIENT DETECTION

CROSS-REFERENCE TO RELATED APPLICATIONS

This application claims priority to U.S. Provisional Application No. 62/814,122, filed Mar. 5, 2019, which is hereby incorporated by reference in its entirety, and U.S. Provisional Patent Application Ser. No. 62/814,115, which was filed on Mar. 5, 2019 and is hereby incorporated herein by reference in its entirety.

BACKGROUND

The proliferation of consumer electronic devices (such as cell phone, wearable devices, e-cigarettes, Internet of Things, sensors and other battery-powered devices) and integrated circuit (IC) technology has resulted in the commercialization of IC products. As new consumer electronic devices are developed and IC technology advances, new IC products are commercialized. One example IC product that is needed in consumer electronic devices is a linear regulator (e.g., a low dropout regulator or "LDO", or a linear amplifier). In one example linear regulator, an output voltage is provided based on an input voltage coupled to a switch, where a control terminal of the switch is coupled to a control circuit. Efforts to reduce power consumption while maintaining output voltage stability are ongoing.

One of the strategies to reduce power consumption involves detecting and responding to variations in the load. The challenges related to this strategy include accuracy, toggling, and power versus speed tradeoff of mode transition. Achieving a very low yet accurate load current (Iload) transition point (the Iload level at which the linear regulator switches between modes) is difficult. Also, conventional approaches have an issue with output voltage (VOUT) pinging (VOUT oscillations due to unstable mode transitions) and offset between low power mode VOUT and high power mode VOUT. Accordingly, continuous-biased references are conventional for conventional LDOs. Another option is to increase DC hysteresis between modes, but this comes at the cost of accuracy and a higher mode transition point.

SUMMARY

In accordance with at least one example of the disclosure, a system comprises an input voltage source and a linear regulator coupled to the input voltage source. The system also comprises a load coupled to an output of the linear regulator. The linear regulator comprises a switch with a first current terminal coupled to the input voltage source and with a second current terminal coupled to an output node. The linear regulator also comprises an error amplifier coupled to a control terminal of the switch. The linear regulator also comprises a reference voltage circuit coupled to the error amplifier and configured to provide a reference voltage to the error amplifier. The linear regulator also comprises a mode selection circuit with a slow loop configured to sample a load current and with a fast loop configured to detect an output voltage error signal. The mode selection circuit is configured to adjust a mode of the reference voltage circuit between a continuous power mode and a duty cycle power save mode based on the sampled load current and the output voltage error signal.

In accordance with at least one example of the disclosure, a linear regulator circuit comprises a switch with a first current terminal coupled to the input voltage source and with a second current terminal coupled to an output node. The linear regulator circuit also comprises an error amplifier coupled to a control terminal of the switch. The linear regulator circuit also comprises a reference voltage circuit coupled to the error amplifier and configured to provide a reference voltage to the error amplifier. The linear regulator circuit also comprises a mode selection circuit with a slow loop configured to sample a load current and with a fast loop configured to detect output voltage error. The mode selection circuit is configured to adjust a mode of the reference voltage circuit between a continuous power mode and a duty cycle power save mode.

In accordance with at least one example of the disclosure, a linear regulator device comprises an input voltage node and an output voltage node. The linear regulator device also comprises a regulation circuit between the input voltage node and the output voltage node. The linear regulator device also comprises an error amplifier coupled to a control terminal of the regulation circuit, wherein the output voltage node is coupled to a first input of the error amplifier. The linear regulator device also comprises a reference voltage circuit coupled to a second input of the error amplifier, wherein a mode of the reference voltage circuit is controlled using a slow loop with a sample-and-hold circuit and using a fast loop with a comparator.

BRIEF DESCRIPTION OF THE DRAWINGS

For a detailed description of various examples, reference will now be made to the accompanying drawings in which:

FIGS. 1A-1C are graphs showing noise as a function of load current and frequency in accordance with some examples;

FIGS. 3, 4A, 4B, and 5 are diagrams showing components for mode selection circuit options in accordance with some examples;

FIG. 7 is a graph showing power supply noise rejection (PSR) for a linear regulator with a mode selection circuit in accordance with some examples;

FIG. 8 is a graph showing output voltage as a function of a supply voltage for a linear regulator with a mode selection circuit in accordance with some examples;

DETAILED DESCRIPTION

Disclosed herein are linear regulators (e.g., a low dropout regulator or "LDO", or a linear amplifier) with a switch and a control circuit coupled to the switch, wherein the control circuit includes a mode selection circuit with a slow loop configured to sample a load current and with a fast loop configured to detect an output voltage error signal. In some examples, the mode selection circuit is configured to adjust the mode of a reference voltage circuit for an error amplifier between a continuous power mode and a duty cycle power save mode (e.g., a sample-and-hold mode or duty-cycle mode) based on the sampled load current and the output voltage error signal. With the mode selection circuit, power savings are achieved in that the quiescent current (Iq) of the mode detect circuit is below 1 nA when there is no load. Also, the mode selection circuit is able to respond quickly to changing load conditions without toggling.

The linear regulator of some example embodiments uses analog floating gate (AFG) technology which contributes little or no noise to the output, independent of load. Sample-and-hold (S/H) bandgap reference circuitry is used in other example embodiments. Since low frequency asynchronous ripple may be induced by the S/H bandgap reference circuitry, the example embodiments offer approaches to mitigate this potential issue. The mode detect approach of the example embodiments can selectively operate using S/H mode at light loads, since low noise is not needed for very light loads (during a low power mode). As an example, for a load current (Iload) less than 300 uA, some small cycle to cycle ripple (<1 mV) is tolerable at light loads. While it is preferred to have not to have large noise or ripple on VOUT, independent of load current, noise and ripple requirements for some example embodiments can be greatly relaxed when Iload is less than 300 uA. In some of the example embodiments, a continuous power mode is used for Iload greater than 300 uA to ensure VOUT ripple is within a desired tolerance. For Iload less than 300 uA, a sample-and-hold low power mode is used, which results in higher VOUT ripple (the higher VOUT ripple is acceptable in a light load condition).

Sensor applications that rely on small volume coin cell batteries, like a CR1612, are typically disposable and intended for one-time use. Since the system utilizes a large, rechargeable lithium ion battery, the system battery life is not limited by the self-leakage of the battery, but instead limited by the standby current of the power management functions, such as the proposed LDO, switching converter, power switches, and supervisors that support a microcontroller (MCU).

Figure 1C:
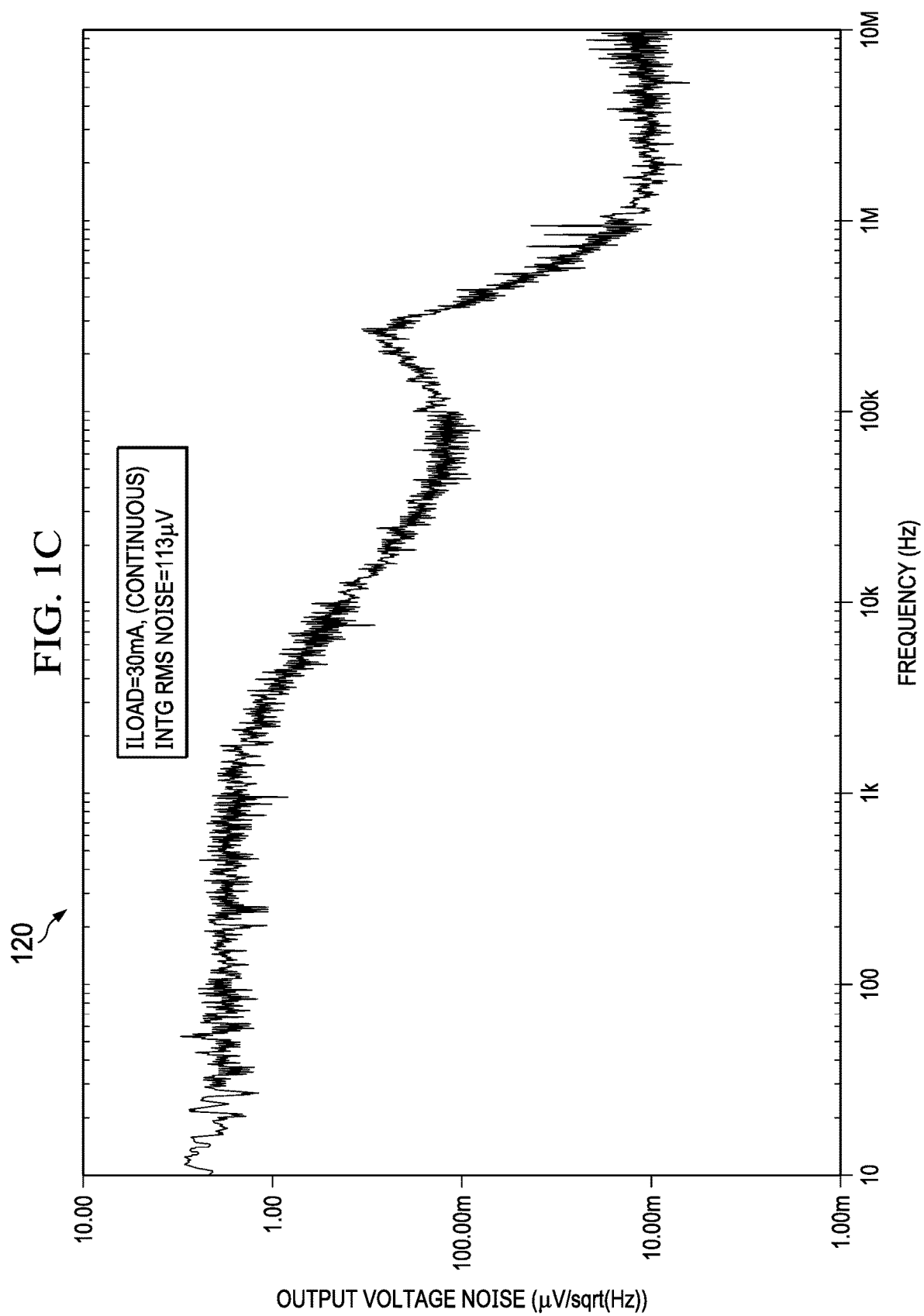

FIGS. 1A-1C are graphs 100, 110, and 120 showing noise (under differing operating conditions) as a function of load current and frequency in accordance with some examples. In graph 100 of FIG. 1A, the operating conditions are: Iload is around 100 uA (light load condition) and the S/H reference is set to 20 Hz. The resulting noise (in RMS) under these conditions is around 85 uV. More specifically, graph 100 shows a set of higher low-frequency noise represented with sharp roll-off and a set of tones outside of the frequency band of interest. In graph 110 of FIG. 1B, the operating conditions are: Iload is around 300 uA (a transition point condition) and a continuous power mode is used. The resulting noise (in RMS) is around 103 uV. More specifically, graph 110 shows a set of lower noise with a wider band and a set of tones outside of the frequency band of interest. In graph 120 of FIG. 1C, the operating conditions are: Iload is around 30 mA (high load condition) and a continuous power mode is used. The resulting noise (in RMS) is around 113 uV.

With LDO circuits of the example embodiments, the noise level when the system is off is a less important performance parameter, because end applications require strict performance levels at normal to high current load conditions, while the performance levels at light load conditions are often relaxed. Thus, in these example embodiments, a reference voltage circuit of the example linear regulator is transitioned from a S/H reference to a continuous reference while the linear regulator is in a low power mode (potentially resulting in some noise). In a low power mode, Iload may be around 100-300 uA. For values of Iload greater than 300 uA, noise and power supply noise rejection (PSR) becomes more relevant, because end applications require strict performance levels at normal to high current load conditions. Also, the S/H reference noise impact at lighter loads is more easily hidden due to the higher noise floor increase at lower biasing and due to the lower bandwidth of the error amplifier, which acts as a low pass filter for the reference voltage. Preferably, the continuous Iq budget (Iq/Iload) is around 0.01 (which assures the current efficiency is greater than 99%) around (above and below) the mode transition point.

In many circuits, lowering Iq reduces the response time of the circuit. This can be problematic because a reduced response time increases VOUT ripple, which is an importance performance parameter for certain end applications. By transitioning from a low power mode to a medium/high power mode for certain components (e.g., bandgap references, resistor dividers, and a scaling amplifier), the linear regulator circuit of the example embodiments can scale Iq to reduce power consumption while mitigating any reduced response time. Also, in accordance with example embodiments other components (e.g., a current limit biasing circuit, a thermal limit circuit, and sample/hold gate bias circuits of the current reference system) can be turned on/off to further reduce power consumption during the low power mode of the example embodiments. In a medium power mode of the example embodiments (which may judiciously use higher Iq during this operating mode), the linear regulator will react faster to errors injected in the loop, specifically from line transients and load transients. By judiciously using higher Iq via mode transition, in scenarios where there is large error injected in the loop, the number of passive components (resistors and capacitors) can be reduced, as reliance on filtering, decoupling, or high speed coupling can be relaxed.

In one example embodiment, a proposed linear regulator with a "no-load" quiescent current below 1 nA uses a current load detection scheme that combines a slow yet accurate sampled analog detection control loop with a fast analog undershoot detection (<1 u sec) and overshoot detection (<100 us). The slow loop offers asymmetric bandwidth with faster entry (>1 Khz) to the low power mode and slower exit (<125 Hz) to the high power (continuous) mode, which enables a quiescent current below 1 nA in a no-load condition. The combination of the fast loop allows this tradeoff. In some examples embodiments, replica field-effect transistor (FET) current accuracy can be improved using two techniques: a) saturation of the replica FET in and out of dropout; and b) applied Vds matching using a duty-cycle technique.

Figure 2:
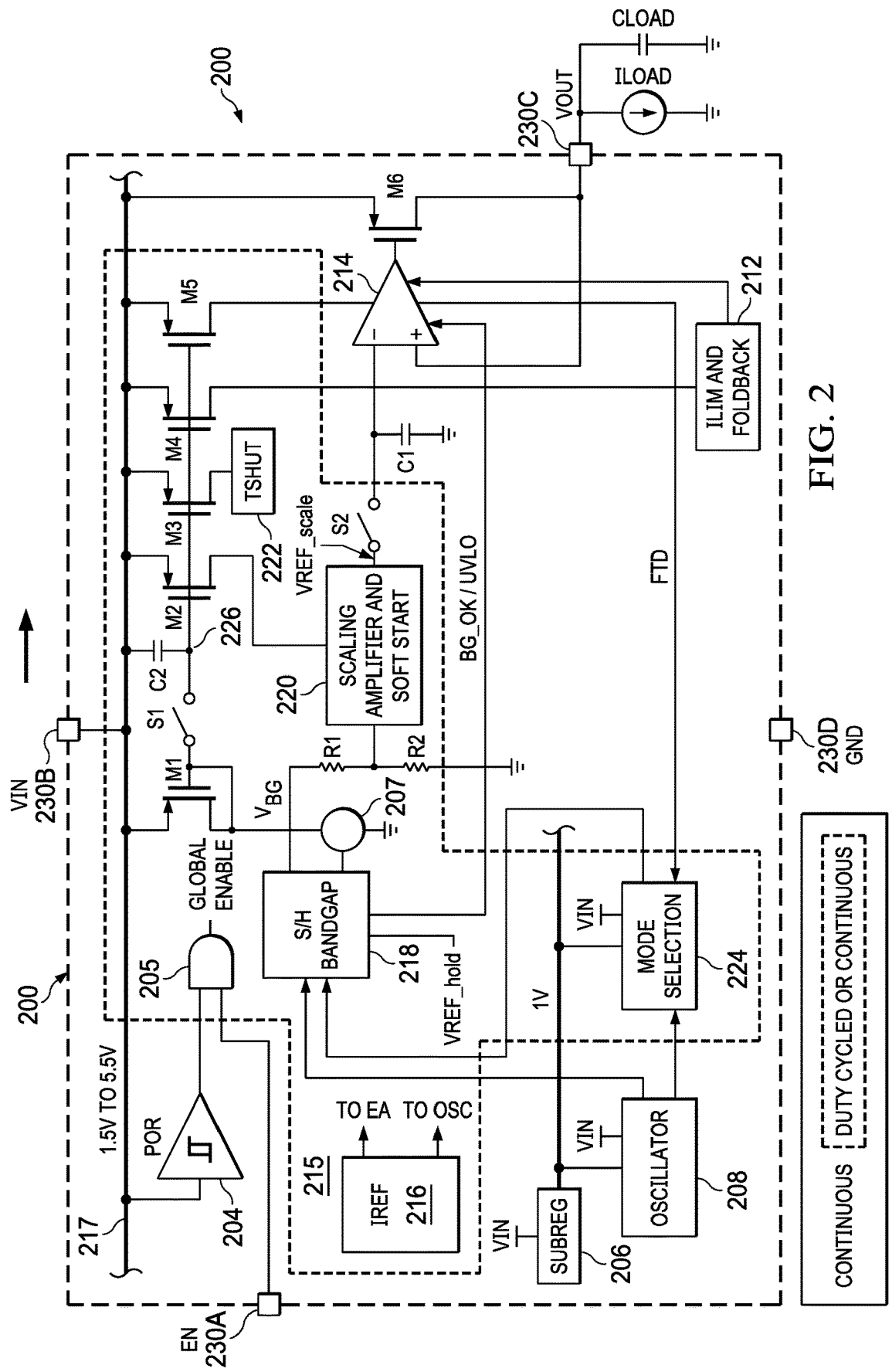
FIG. 2 is a diagram showing a linear regulator device in accordance with some examples.

FIG. 2 is a diagram showing a linear regulator device 200 in accordance with example embodiments. In the example of FIG. 2, the linear regulator device 200 is implemented into an unpackaged integrated circuit (IC), a multi-die module (MDM), or a packaged IC. While the example of FIG. 2 illustrates certain features being inside or outside of the integrated circuit, more or less features may be incorporated onto the integrated circuit. In some examples, the linear regulator device 200 includes an enable node or pin 230A, an input voltage (VIN) node or pin 230B, an output voltage (VOUT) node or pin 230C, and a ground node or pin 230D. As shown, the linear regulator device 200 includes a switch corresponding to a transistor (M6) with a first current terminal coupled to a rail 217, where the rail 217 is coupled to the VIN node 230B. The second current terminal of M6 is coupled to the VOUT node 230C. At the VOUT node 230C, VOUT is provided to a load represented by a capacitor (CLOAD), where the load current (ILOAD) at the VOUT node 230C is represented by an ILOAD source. An example of the load is one or more sensors (e.g., automotive sensors). In operation, VOUT is a function of VIN and the control signal provided to control terminal of M6. As shown, the control terminal of M6 is coupled to a control circuit 215 via an error amplifier 214. The non-inverting input of the error amplifier 214 is coupled to the VOUT node 230C, and the inverting input of the error amplifier 214 is coupled to a control circuit 215.

In the example of FIG. 2, the control circuit 215 is configured to provide a reference voltage to the inverting input of the error amplifier 214. More specifically, the control circuit 215 supports different modes to provide the reference voltage and/or other control signals. Example modes include a low power mode (or duty cycle power save mode), a medium power (continuous) mode, and a high power (continuous) mode. To select the different modes, the control circuit 215 includes a mode selection circuit 224, that includes both a slow loop configured to sample a load current and a fast loop configured to detect an output voltage error signal (referred to as a fast transient detect (FTD) signal). In the example of FIG. 2, the FTD signal is provided by one of the stages of the error amplifier 214 separate from the output of the error amplifier 214 (see FIG. 4B). The mode selection circuit 224 also receives VIN, an oscillation frequency signal from an oscillator 208, and regulated voltage (e.g., 1V) from a subreg circuit 206 configured to reduce VIN. The control circuit 215 also includes a reference current (IREF) circuit 216 configured to provide IREF (e.g., $\Delta$VGs/R) to the error amplifier 214 and the oscillator 208.

As shown, the control circuit 215 also includes a S/H bandgap circuit 218 coupled to the oscillator 208 and the mode selection circuit 224. The S/H bandgap circuit 218 also receives a global enable signal from an AND gate 205, where the inputs to the AND gate 205 are provided by: 1) a POR circuit 204 configured to determine that the power supply is good; and 2) the enable node or pin 230A. In operation, the S/H bandgap circuit 218 provides a bandgap voltage ($V_{BG}$) that is scaled by a voltage divider (R1 and R2), such that scaled $V_{BG}$ is input into a scaling amplifier and soft start circuit 220 of the control circuit 215. The S/H bandgap circuit 218 also provides a voltage reference hold signal (VREF_hold, where VREF_hold is a scaled version of $V_{BG}$). VREF_hold is used by the mode selection circuit 224 to determine which mode will be used. The output of the scaling amplifier and soft start circuit 220 is a scaled voltage reference signal (VREF_scale) that is provided to the inverting input of the error amplifier 214 via a switch S2. As shown, a capacitor (C1) is coupled between the inverting input of the error amplifier 214 and a ground node to store VREF_scale at the inverting input of the error amplifier 214. The control circuit 215 also includes various transistors (M1-M5), a current source 207 coupled to or included with the S/H bandgap circuit 218, a capacitor (C2), and a switch (S1), where S1 is between the control terminal of M1 and the control terminals of M2-M5, and where C2 is between the VIN node 230B and a node 226 between S1 and the control terminals of M2-M5. Also, the first current terminals of M1-M5 are coupled to the VIN node 230B. When S1 is closed, C2 is charged resulting in current flow through M2-M5, where the current through M2 is provided to the scaling amplifier and soft start circuit 220, the current through M3 is provided to a thermal shutdown circuit 222, the current through M4 is provided to a current limit and foldback circuit 212, and the current through M5 is provided to the error amplifier 214. In operation, the thermal shut-down circuit 222 is configured to shut down the linear regulator device 200 in response to a thermal condition indicated by the current through M3 and a thermal sensor in TSHUT block.

In FIG. 2, the linear regulator device 200 includes other components such as a current limit and foldback circuit 212. The current limit and foldback circuit 212 is configured to limit a current to the error amplifier 214 based on the current through M4. In an example embodiment, the smart enable circuit 202, the subreg circuit 206, the oscillator circuit 208, the OTP circuit 210, and the error amplifier 214 stay in a powered or continuous state regardless of the mode of the control circuit 215.

Figure 3:
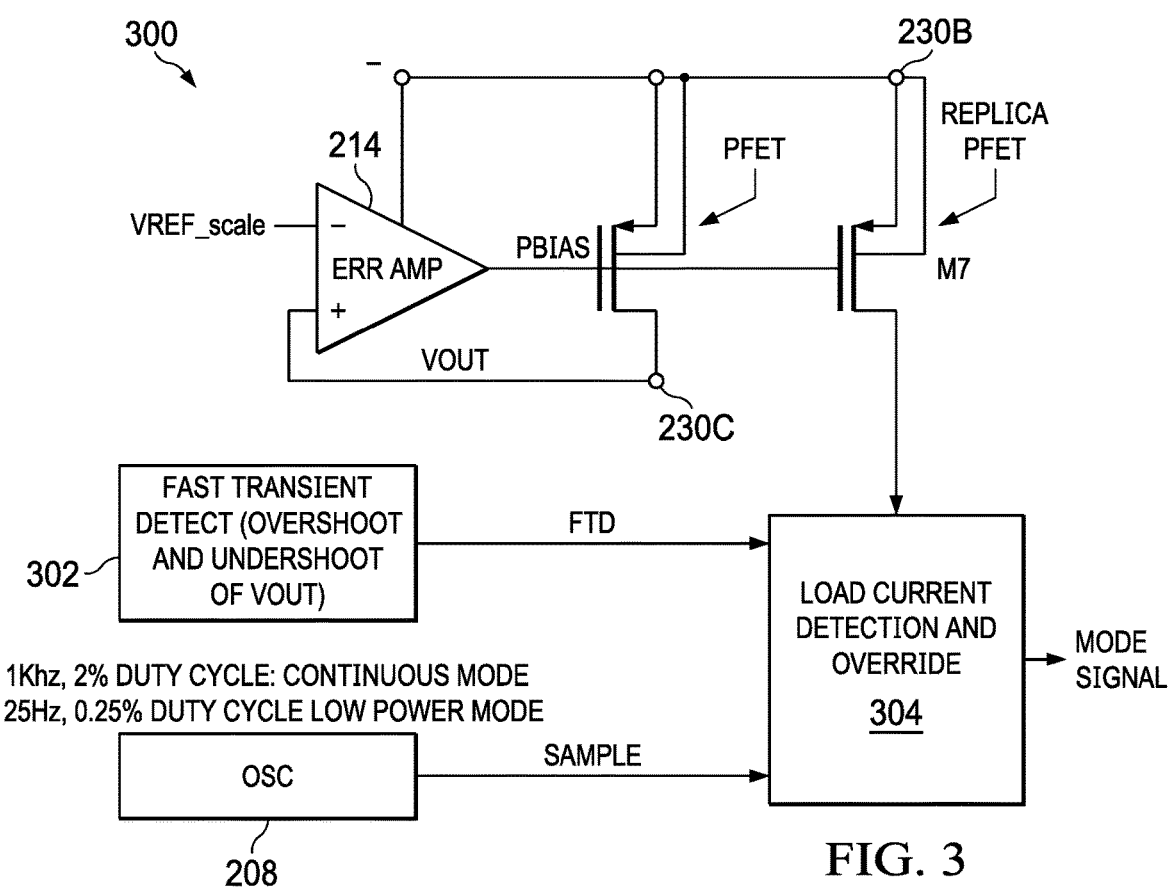

In an example embodiment, linear regulator device 200 reduces Iq at light loads even when in drop-out condition (VIN≤OUT(target)). In some examples, this is achieved by adding a resistor before the tap point of the scaling amplifier output (e.g., by adding a resistor between the S/H bandgap 218 and R1 in FIG. 2), thereby creating an offset on the reference and thus the output when the linear regulator device 200 enters dropout at loads less than 1 mA. Adding a resistor lowers VREF_scale when in dropout, causing the control loop to remain in regulation in the dropout condition. Additionally, other circuits depending on power FET replica biasing at light loads benefit with improved replica matching since the replicas are kept in saturation. This is valuable for mode-detect accuracy. An example embodiment with a replica FET is shown in FIG. 3.

Management of low frequency tones introduced directly on the LDO output via the reference system is an issue that can be overcome by some example embodiments. In the some of these example embodiments, four strategies can be utilized to overcome this ripple on the LDO output. The first technique involves heavily filtering the reference signal using a sample capacitor (CF) and a resistor (RF), thereby achieving a time constant (RF*CF) that is greater than 60 μs during the sampling period. The second technique uses an adaptive time generator to create a "pre-sample" settling of the scaling amplifier that is less than 1 mV accurate and that has a dedicated sampling time proportional to RFCF. The adaptive timer balances the low-duty cycle Iq target with reduced sampling error. The third technique employs common charge-injection cancellation. The last technique, which is preferable, is to turn-off the sample-hold mode when the load current crosses above a well-defined load current threshold (preferably around 350 uA). With these techniques, not only are tones removed, but the power supply rejection ratio (PSR) and Line/Load transient response are improved. The example embodiments utilizes the effect that systems in a stand-by power mode (or off) are more tolerant to low frequency tones, lower PSR, and worse line transient response. However, the reference needs to enter continuous mode quickly and accurately when there is transient error on the LDO output and re-enter the low power mode quickly after very light loads are detected.

In accordance with other example embodiments, FIGS. 3, 4A, 4B, and 5 are diagrams showing components for mode selection circuit options 300, 400, and 500 (e.g., components of the mode selection circuit 224, where the error amplifier 214 is represented as part of the mode selection circuit 300). The mode selection circuit option 300 of FIG. 3 includes the error amplifier 214, where the output of the error amplifier 214 is coupled to the control terminals of a power FET (M6 as in FIG. 2) and a replica power FET (M7). As shown, the error amplifier, a first current terminal of M6, and a first current terminal of M7 are coupled to the VIN node 230B. Also, the non-inverting input of the error amplifier 214 is coupled to a second current terminal of M6, which corresponds to the VOUT node 230C. The second current terminal of M7 is coupled to a load current detection and override circuit 304 configured to detect a load current based on the FTD signal from a fast transient detect circuit 302. In some examples, the fast transient detect circuit 302 corresponds to an early stage of the error amplifier 214.

The load current detection and override circuit 304 also receives a sample signal from the oscillator 208. In some examples, the sample signal has a first frequency (e.g., around 1 kHz or around 2% duty cycle) in the continuous power mode, and has a second frequency (e.g., around 125 Hz, or around 0.25% duty cycle) in the duty cycle power save mode. In the example of FIG. 3, the load current detection and override circuit 304 is configured to output a mode signal (e.g., low power duty cycle mode, medium power continuous mode, high power continuous mode) based on the replica load current through M7, the FTD signal, and the sample signal.

In some examples, the mode selection circuit 300 enables a linear regulator (e.g., the linear regulator device 200) to have an average quiescent current below 25 nA in the duty cycle power save mode, and to have an average current of <1% load current in the continuous power mode. In the example of FIG. 3, the slow loop of the mode selection circuit 300 (e.g., M7 and components of the load current detection and override circuit 304) is overridden when an asynchronous FTD signal rising edge (e.g., from the error amplifier 214) is received. In such case, the continuous power mode is used for a predetermined time interval (e.g., 2 ms). Also, in some examples, the slow loop of the mode selection circuit 300 is overridden for a predetermined time interval (e.g., 100 ms) during startup or after an undervoltage-lockout (UVLO) event.

In some examples, the mode signal from the load current detection and override circuit 304 is used to turn off a current limit circuit (e.g., the current limit and foldback circuit 212 in FIG. 2) during the duty cycle power save mode. Also, a UVLO circuit (e.g., part of the S/H bandgap circuit 218) is duty cycled and a thermal shutdown circuit (e.g., the thermal shutdown circuit 222 in FIG. 2) is turned off in the duty cycle power save mode. A bandgap circuit (e.g., the S/H bandgap circuit 218 in FIG. 2) and a scaling amplifier (e.g., the scaling amplifier and soft start circuit 200) are duty cycled for S/H operations in the duty cycle power save mode. Also, an IREF source (e.g., the IREF circuit 216 in FIG. 2) is duty cycled for S/H operations in the duty cycle power save mode. Preferably, the error amplifier 214 stays on and the operations of the error amplifier continue regardless of the mode signal output from the load current detection and override circuit 304.

Figure 4A:
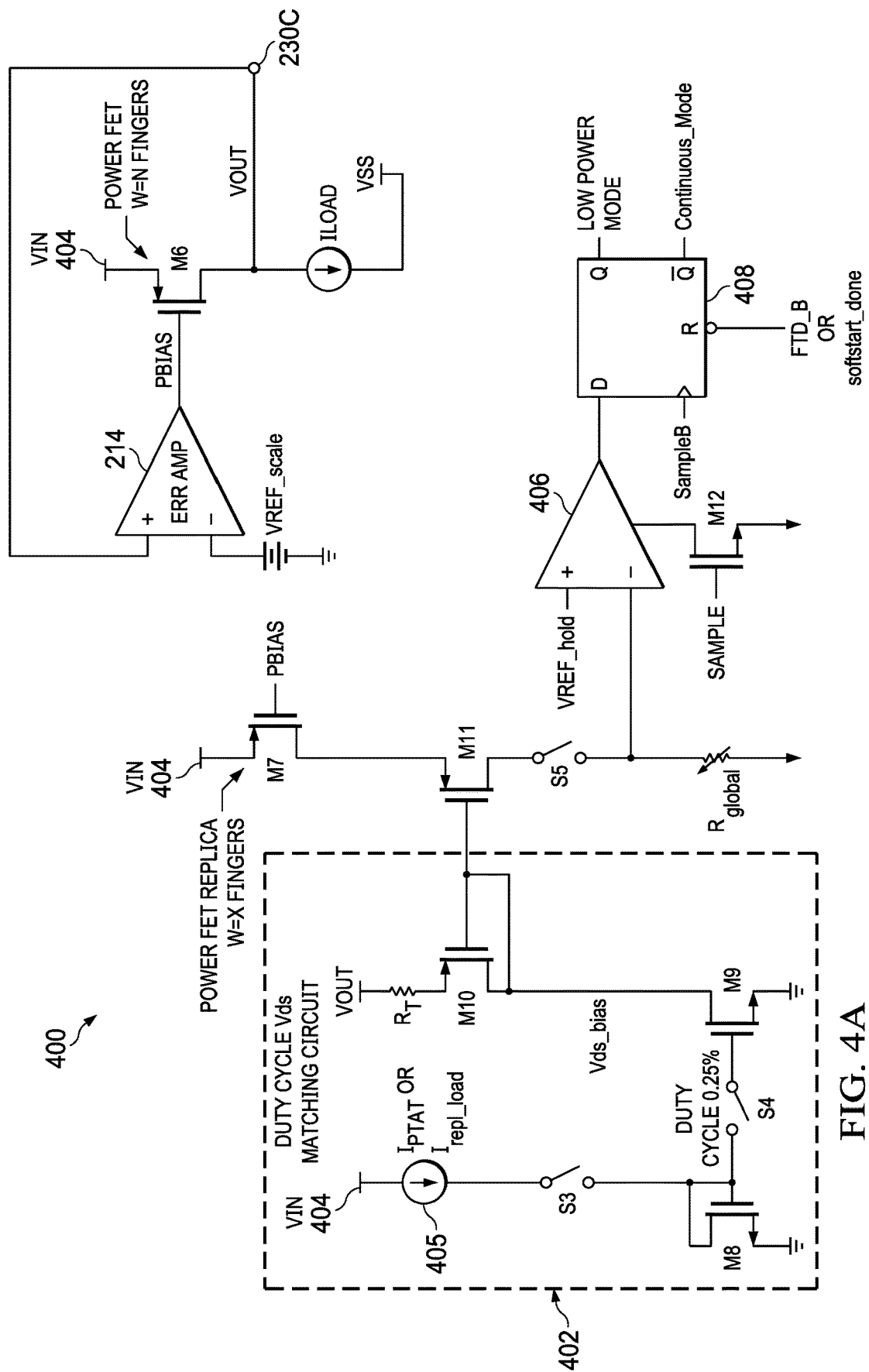
Figure 5:
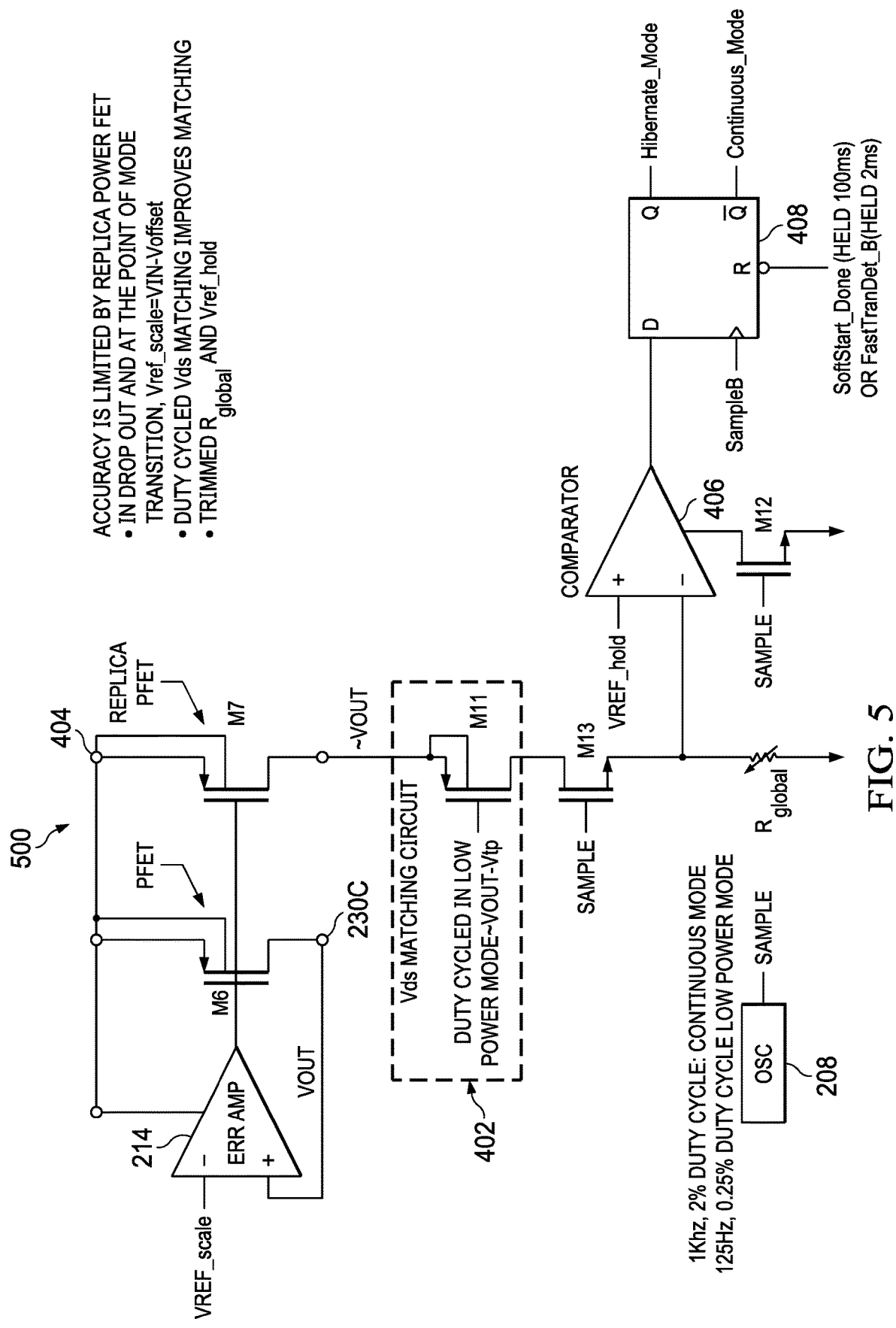

In some examples, the mode selection circuit 300 feeds the replica load current through M7 onto a trimmed resistor (e.g., $R_{global}$ as in FIGS. 4A and 5). The resulting voltage is compared to a trimmed reference for accurate detection and precise control of the transition between a S/H reference and a continuous reference to enable an optimum noise profile and power across a load at the VOUT node 230C.

Mode selection circuit 400 of FIG. 4A includes the error amplifier 214 and M6, where the first current terminal of M6 is coupled to a VIN node 404 (e.g., the VIN node 230B) and the second current terminal of M6 is coupled to the VOUT node 230C. Also, the non-inverting input of the error amplifier 214 is coupled to the VOUT node 230C, and the inverting input of the error amplifier 214 receives a voltage reference signal (VREF_scale). In the example of FIG. 4A, M6 has a channel width ratio of N relative to M7 (e.g., the channel width of M6 at least 100 times larger than the channel width of M7). In FIG. 4A, the output (PBIAS) of the error amplifier 214 is coupled to the control terminal of M6.

As shown, the mode selection circuit 400 also includes a duty cycle Vds matching circuit 402 with a replica load current ($I_{repl\_load}$) from current source 405 (e.g., M7 in FIG. 3) coupled to a VIN node 404 (an example of the VIN Node 230B in FIG. 2). In some examples, a current proportional-to-absolute-temperature ($I_{PTAT}$) is used instead of $I_{repl\_load}$. The replica load current ($I_{repl\_load}$) source 405 is converted to a voltage value using a variable resistor ($R_{global}$), where the voltage value is compared to VREF_hold by a switched comparator 406 (where transistor M12 is clocked or duty-cycled to reduce the average Iq of the switched comparator 406). More specifically, $I_{repl\_load}$ is conveyed to the inverting input of the switched comparator 406 via a first current mirror (M8 and M9) and a second current mirror (M10 and M11), where various switches (S3, S4, and S5) control the timing of providing $I_{repl\_load}$ to the inverting input of the switched comparator 406. In some examples, S3 is controlled by an enable signal, S4 is controlled by a duty cycle (e.g., 0.25%), and S5 is controlled by a duty-cycled version of the sample signal from the oscillator 208 in FIG. 3. As shown, a first current terminal of M11 is coupled to a second current terminal of M7. Also, the first current terminal of M7 is coupled to the VIN node 404, and the control terminal of M7 is coupled to the output (PBIAS) of the error amplifier 214, where the Vds for M6 and M7 are matched to ensure proper matching of ratio currents from M6 to M7.

In the example of FIG. 4A, M12 is controlled by a sample signal (e.g., from the oscillator 208). Also, $R_{global}$ is coupled between the inverting input of the switched comparator 406 and a ground node, resulting in a voltage at the inverting input that is a function of the replica load current and $R_{global}$. In some examples, $R_{global}$ is trimmed based on a target threshold and resistor material variation. Also, $R_{global}$ is used to determine a hysteresis for the switched comparator 406. As shown, the output of the switched comparator 406 is provided to a latch 408 clocked by an inverted version (SampleB) of the sample signal. The output of the latch 404 is used to provide mode signals (e.g., duty cycle power save mode and continuous power mode). Also, the reset node of the latch 408 is configured to a receive a first control signal (softstart_done) to indicate when a softstart interval (e.g., 100 ms) is complete. Also, the reset node of the latch 408 is configured to receive a second control signal (FTB_B) to indicate when a continuous power mode interval (e.g., 2 ms) is complete.

As shown, the mode selection circuit option 420 of FIG. 4B includes a representation of the error amplifier 214. Specifically, the error amplifier 214 is represented in FIG. 4B as having a first stage with transistors MP1, MP2, MIN1, MIN2, current source 452, a capacitor ($C_{AC}$), and transistor M13. When VOUT differs from VREF_scale (as large current is pulled through the AC path 454), a voltage change at node 456 occurs. The voltage change at node 456 results in a fast transient detect (FTD) signal at node 458 based on the operations of various transistors ($M_{P8}$, $M_{N2}$, $M_{N1}$). The FTD signal and related components are part of a fast loop 430 used to provide control signals to a reference system 432 (e.g., the control circuit 215 herein). The mode selection circuit option 420 also includes a slow loop 422 that includes a current-to-voltage converter 424 coupled to the output node 432 (e.g., the output node or pin 230C). The slow loop 422 also includes a comparator 426 (e.g., the comparator 406 in FIG. 4A) selectively operated at different rates (e.g., 125 Hz and 1 kHz). The slow loop also includes an OR gate 428 configured to pass the output of the comparator 426 or the FTD signal to the reference system 432. With a fast change in VOUT as represented in graph 450, the current of $M_{P8}$ is quickly boosted, causing the FTD signal to trigger as represented in graph 440.

As shown, the mode selection circuit 500 of FIG. 5 includes the error amplifier 214 and M6, where the first current terminal of M6 is coupled to a VIN node 404 (e.g., the VIN node 230B) and the second current terminal of M6 is coupled to the VOUT node 230C. Also, the non-inverting input of the error amplifier 214 is coupled to the VOUT node 230C, and the inverting input of the error amplifier 214 receives VREF_scale. In FIG. 5, the output of the error amplifier 214 is coupled to the control terminal of M6 and to the control terminal of M7 (a replica PFET).

As shown, the first current terminal of M7 is coupled to the VIN node 404, and the second current terminal of M7 is coupled to the inverting input of the switched comparator 406 via two transistors (M11 and M13), where M11 is represented as part of the duty cycle Vds matching circuit 402, and where the control terminal of M11 is configured to receive a control signal that is duty cycled in the duty cycle power save mode (e.g., ~(VOUT−Vtp), where Vtp is the threshold voltage such that Vds across M6 and M7 are matched). In the example of FIG. 5, a replica load current results in a voltage at the inverting input of the switched comparator 406 (where transistor M12 is controlled/clocked after the inputs of the switched comparator 406 have been precharged). In the example of FIG. 5, M12 is controlled by a sample signal from the oscillator 208, where the frequency of the sample signal is a first frequency (e.g., around 1 KHz or around 2% duty cycle) in the continuous power mode, and where the frequency of the sample signal is a second frequency (e.g., around 125 Hz or around 0.25% duty cycle) in the duty cycle power save mode. Also, $R_{global}$ is coupled between the inverting input of the switched comparator 406 and a ground node, resulting in a voltage at the inverting input that is a function of the replica load current and $R_{global}$. In some examples, $R_{global}$ is trimmed based on a target threshold and variations in the resistor. Also, $R_{global}$ is used to determine a hysteresis for the switched comparator 406. As shown, the output of the switched comparator 406 is provided to the latch 408 as described in FIG. 4A.

In the example of FIG. 5, the accuracy of the replica load current is limited. In dropout and at the point of mode transition, VREF_scale=(VIN−Voffset), where Voffset is provided using a resistor to lower VREF_scale when in dropout, which causes the control loop to remain in regulation in the dropout condition (to ensure both M6 and M7 are always in saturation in dropout). In some examples, the duty cycled Vds matching circuit 402 improves the match between the load current and the replica load current. Also, in some examples, Rglobal and VREF_hold are trimmed to improve the overall accuracy of the replica load current.

In some examples, the mode selection circuit 500 provides control loop stability by minimizing mode toggling using a short (preferably around 1 ms or more) hysteresis delay and sufficient DC hysteresis (e.g., an offset of around 20% from the ILOAD transition point) in the slow loop (the replica load current loop). The mode selection circuit 500 also uses a forced minimum interval or blanking period (~2 ms) in response to the FTD signal being greater than a threshold so that the slow loop can take over after the forced minimum interval or blanking period. Also, with the mode selection circuit 500, the mode signal output from the latch 408 does not change biasing in the error amplifier 214, and thus mode transitions have little to no impact on loop gain/stability.

With the mode selection circuit options represented in FIGS. 3, 4A, 4B, and 5, the mode detect plays a role to enable higher PSR, lower noise and higher line transient immunity when a linear regulator is actively loaded. The integration of a slow loop (e.g., the slow loop 422 in FIG. 4B and related components) and fast transient detect circuit (e.g., the fast loop 430 represented in FIG. 4B and related components) can uniquely operate with Iq preferably less than 1 nA in low power mode and yet accurately (preferably around +/−20% or less, for example 150 uA, which is the difference between 200 uA and 350 uA in one example) detect a small (preferably around 200 μA) falling and a small (preferably around 350 μA) rising load current trigger thresholds. Also, the fast transient detect circuit activates the (high power) continuous mode in preferably less than 1 μs for dips on VOUT, and preferably less than 200 μs for overshoots on VOUT. The slow loop acts as the master entry into low power mode taking up to around 1 ms, while also allowing entry to continuous mode but at a slower speed (preferably up to 8 ms). The low power mode enables the sample/hold reference system functionality and gates off the thermal shutdown and current limit blocks. The "always-on" section that includes the error amplifier has its own set of techniques to throttle the Iq to a small proportion of the load current (preferably around 1% of load current) in a continuous manner.

Figure 6A:
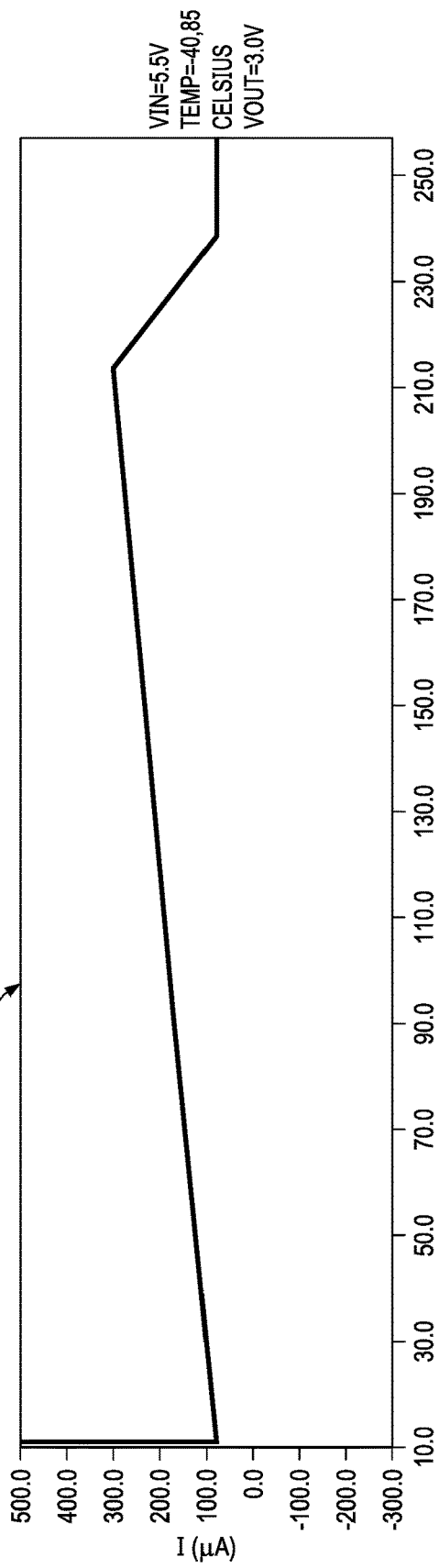
FIGS. 6A and 6B are graphs showing load current detection accuracy of a mode selection circuit in accordance with some examples.
Figure 6B:
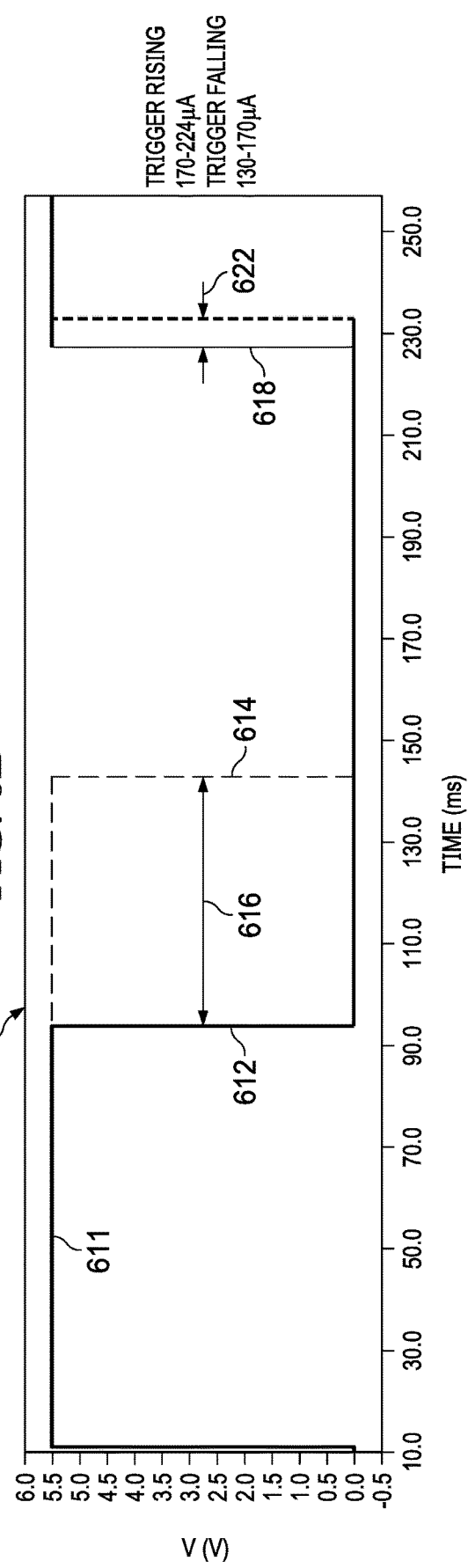

Graphs 600 and 610 in FIGS. 6A and 6B show accuracy of a mode selection circuit (e.g., the mode selection circuit 224 in FIG. 2, or the mode selection circuit 300, 400, or 500 in FIGS. 3-5) in accordance with some examples. The Y-axis of FIG. 6A is load current (in micro Amps) and the X-axis is time (in milliseconds). Graph 600 was plotted under the following conditions: VIN=5.5V, VOUT=3.0V, and the temperature range is −40 to 85 degrees Celsius.

The graph 610 of FIG. 6B is a graph showing transitions of a low power control signal 611 as a function of time. In graph 610, the low power control signal 611 starts high, indicating a low power mode. When the low power control signal 611 goes low at edge 612, a high power mode begins. When the low power control signal 611 goes high again at edge 618, a low power mode begins again. With the proposed mode control options, the timing of rising or falling transitions of the low power control signal 611 should be accurate within the respective intervals 616 and 622 as Iload slowly increases and slowly decreases independent of PVT (Process, Vin, and Temperature).

FIG. 7 is a graph 700 showing power supply noise rejection (PSR) for a linear regulator (e.g., the linear regulator device 200 in FIG. 2) with a mode selection circuit (e.g., the mode selection circuit 224 in FIG. 2, or the mode selection circuit 300, 400, or 500 in FIGS. 3-5) in accordance with some examples. The operating conditions for graph 700 include: VIN=3.5V, VOUT=1.8V to 2V, and the load current (Iload) is 30 mA. The waveform 702 represents PSR for a duty cycle power save mode (S/H mode) with a 6 pF S/H capacitor. Waveform 704 represents PSR for a continuous power mode. As shown, the continuous power mode has better PSR performance compared to the duty cycle power save mode for lower frequencies. For higher frequencies, the PSR performance of the duty cycle power save mode and the continuous power mode are approximately the same.

FIG. 8 is a graph 800 showing input voltage (top graph) and output voltage (bottom graph) as a function of a supply voltage for a linear regulator (e.g., the linear regulator device 200 in FIG. 2) with a mode selection circuit (e.g., the mode selection circuit 224 in FIG. 2, or the mode selection circuit 300, 400, or 500 in FIGS. 3-5) in accordance with some examples. In the graph 800, the waveform 802 represents VIN, the waveform 804 represents VOUT with a forced duty cycle power save mode, and the waveform 806, represents VOUT with a forced continuous power mode. As needed, the continuous power mode is used to reduce VOUT transients compared to the duty cycle power save mode. As described herein, the FTD signal can be used to force the continuous power mode for a time interval (e.g., 2 ms), which reduces VOUT transients. After the time interval, the duty cycle power save mode can be used again, which reduces power consumption of a linear regulator.

In some examples, a linear regulator (e.g., the linear regulator device 200) supports different modes according to Table 1.

| Iload | Mode name | Iq Duty Cycled: (nA) | Iq Continuous: Variable w/Iload Err Amp | Iq (DC + continuous) Iq Total | Current Efficiency |
|---|---|---|---|---|---|
| 0 | Duty cycle | 8 | 12 nA | 20 nA | 0% |
| 5 u < Iload < 300 uA | power save mode | 18 | <0.5%*Iload | <1% Iload | 99% |
| 300 uA < Iload < 10 mA | Medium continuous power mode | 460 | <0.4%*Iload | <0.5% Iload | 99.5% |
| >~10 mA | High continuous power mode | 1260 | <0.15%*Iload | <0.2% Iload | 99.8% |

In Table 1, three difference modes are used, a low power (duty cycle) mode is used for Iload values below 300 uA. For Iloads between 300 uA and 10 mA, a medium power mode with a continuous reference is used. For Iloads greater than 10 mA, a high power mode with a continuous reference is used.

In some examples, a linear regulator (e.g., the linear regulator device 200) supports different Iload transitions according to Table 2.

| Transition Type | Iload1 | Iload2 | Iload rise/fall time (s) | Trigger Iload or Vout err | Detection Speed |
|---|---|---|---|---|---|
| Startup | 0 | 0 | N/A | N/A | Forced 150 ms Continuous |
| Fast-Small Iload step up | 0 | 500 uA | 1 n | 200 uA | ~1-8 ms (sync to CLK) |
| Fast-Large Iload step up | 0 | 200 mA | 1 n | ~1 mA | 1-2 us, async FTD-Forced 2 ms Continuous |
| Slow-Small Iload step up | 0 | 500 uA | 100 m | 200 uA | ~1-8 ms (sync to CLK) |
| Slow-Large Iload step up | 0 | 200 mA | 100 m | 200 uA | ~1-8 ms |
| Fast-Small Iload step down | 500 u | 0 | 1 n | 150 uA | ~1 ms (sync to CLK) |
| Fast-Large Iload step down | 200 mA | 0 | 1 n | Vout overshoot >50 mV | ~50-100 us, async FTD Forced 2 ms Continuous |
| Slow-Small Iload step down | 500 uA | 0 | 100 m | 150 uA | ~1 ms (sync to CLK) |
| Slow-Large Iload step down | 200 mA | 0 | 100 m | 150 uA | ~1 ms (sync to CLK) |

In Table 2, example Iload transitions, Iload rise/fall times, triggers, and detection speed values are provided.

Figures 9A, 9B:
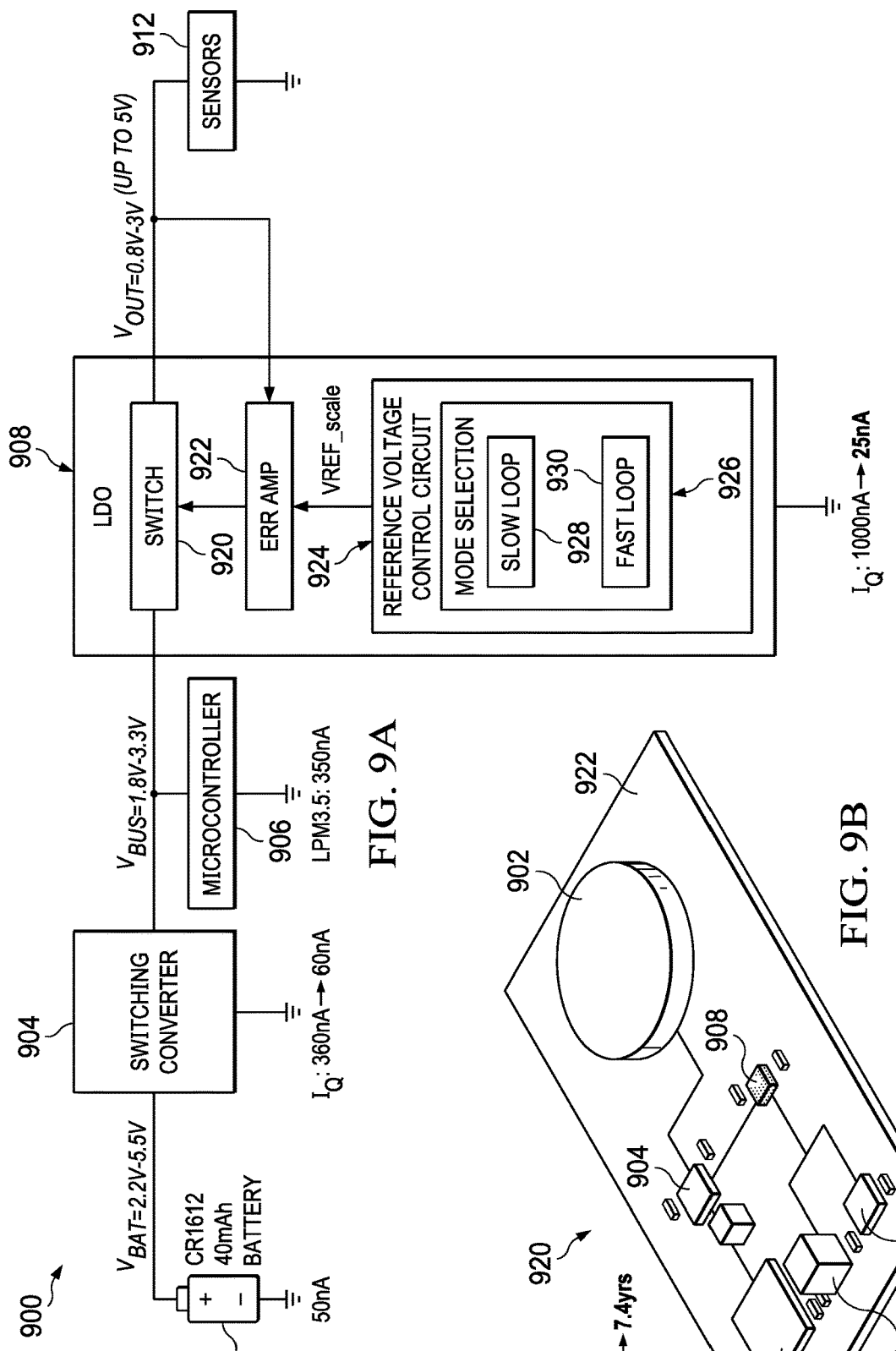
FIG. 9A is a block diagram of a system in accordance with some examples.
FIG. 9B is a perspective view of a circuit with the system components of FIG. 9A in accordance with some examples.

FIG. 9A is a block diagram of a battery-operated electronics system 900 in accordance with an example embodiment. As shown, the system 900 includes a battery 902 coupled to a switching converter 904 and configured to provide an input voltage (e.g., 2.2V-5.5V) to the switching converter 904. In some examples, the battery 902 corresponds to a CR1612 40 mAh battery. The output of the switching converter 902 is a bus voltage (e.g., 1.8V-3.3V) provided to a microcontroller 206 and an LDO circuit 908. In some examples, the microcontroller 206 is configured to send information to and/or receive information from a load 912 (e.g., sensors) via an output (e.g., 0.8V-3.3V) of the LDO circuit 908. In the example of FIG. 9A, the LDO circuit 908 [which reduces the Iq compared to other LDO circuit topologies (represented in FIG. 9A as a reduction from 1000 nA to 25 nA)] includes: a switch 920 (e.g., M6 herein), an error amplifier 922 (e.g., the error amplifier 214 herein), a reference voltage control circuit 924 (e.g., the control circuit 215 herein), a mode selection circuit 926 (e.g., the mode selection circuit 224 herein), a slow loop 928 (e.g., the slow loop 422 and related components), and a fast loop 930 (e.g., the fast loop 430 and related components). With the reduced Iq of the LDO circuit 908 and/or other improvements (e.g., reduced Iq of the switching converter 904 and/or reduced power consumption of the microcontroller 906), the lifetime of the battery 902 with the system 900 is extended from approximately 2.7 years to approximately 7.4 years.

FIG. 9B is a perspective view of a circuit 920 with the system components of FIG. 9A in accordance with inventive examples. In FIG. 9B, the circuit 920 includes a printed circuit board (PCB) 922 with the battery 902, the switching converter 904, the microcontroller 906, the LDO circuit 908, and the load 912 mounted to the PCB 922.

With the linear regulator options described herein, a mode selection scheme is configured to detect a load current level (using a slow loop) and a transient VOUT or VIN error (using a fast loop) in order to turn-on/off or to duty-cycle bias circuitry in order effectively balance trade-offs between quiescent current and current efficiency (Iq/Iload) versus the noise, power supply rejection, area-cost, and line/load transient response. Since linear regulators (e.g., LDOs and Amplifiers) are not clocked, a new solution was developed to account for desired design parameters.

In order for an LDO to achieve a no load Iq of less than 20 nA and to achieve a current efficiency greater than 99% or Iq/Iload less than 1% across load range, the mode selection scheme uses load current detection and override circuitry (e.g., the load current detection and override circuit 304 in FIG. 3, or related components in FIGS. 4 and 5) uses a precise detection scheme that achieves accurate yet low Iload trigger thresholds (e.g., <150 uA even in drop out where VIN<=VOUT). Also, the load current detection and override circuitry can operate with no load (e.g., Iq less than 1 nA); is functional at temperatures up to 150 degrees Celsius; and can seamlessly arbitrate between both slow and fast transient load/line events.

In some examples, the mode selection scheme combines a synchronous slow loop with accurate detection of "light" load current thresholds (150 uA falling/300 uA rising) combined with an asynchronous fast loop detecting VOUT error to control a sample/hold reference system (current and voltage) and to gate other functions (e.g., current limit and thermal shut down) that are only needed at high load currents. Using some example embodiment, a system can achieve: 1) current efficiency >99% for loads >5 uA by gating continuous bias current functions not needed at light loads; 2) eliminate low frequency tones from S/H for loads >150 uA when load is fully active; 3) improve low frequency PSR for loads >150 uA when load is active; 4) improve recovery time for line/load transient errors induced by the sample/hold reference system for loads >150 uA when the load is active; 5) reduce area of the sampled/hold capacitor by relaxing PSR/line/load transient criteria at light loads; and 6) forced high power mode in startup and fault conditions such as thermal shut down.

In some example embodiments, a slow loop for load current detection uses a well-matched power FET replica to sense load current at very light loads using a sampled/duty-cycled technique. The replica load current is provided to a resistive sense element and the resulting voltage is compared against a reference at a mode-dependent fixed low-frequency with the ability to be asynchronously triggered by a fast transient voltage dip or overshoot error on VOUT.

Lowering Iq reduces the response time of most circuitry. In the linear regulators of some example embodiments, transitions from a duty cycle power save mode to medium/high power mode are made on-the-fly to scale Iq and thus improve performance of critical blocks such as the bandgap circuit and the scaling amplifier, and to turn on/off circuitry for current limit biasing, thermal limiting, and sample/hold gate biasing of the current reference system. In medium power modes, these blocks will react faster to errors injected in the loop, specifically from line transients and load transients. By judiciously using higher Iq via mode transitions in scenarios where there is large error injected in the loop, passive components (e.g., resistors and capacitors) can be reduced as reliance on filtering, decoupling, or high speed coupling can be relaxed.

With the linear regulator of some example embodiments, low frequency tones are mitigated (preferably removed), PSR is improved, line/load transient response is improved above a certain low accurate threshold (e.g., 150 uA+−20%) via mode change from S/H control to continuous control of the reference system in an LDO or another linear regulator. In some examples, a sub-1 nA no load detection scheme is achieved in an LDO by combining a slow loop (e.g., to sample an Iload replica, convert to voltage, and compare with a precise reference using a high gain switched or clocked comparator) and a fast loop (e.g., to detect asynchronous VOUT overshoot and undershoot). In some examples, the slow loop uses a low dual fixed-frequency (e.g., 1 KHz/125 HZ) for relative fast (e.g., 1 ms) entry to duty cycle power save mode, and slower (e.g., up to 8 ms) exit to high power mode. An asynchronous FTD signal indicating VOUT undershoot or overshoot will override the slow loop quickly (e.g., <1 us) and is arbitrated by forcing continuous power mode for a time interval (e.g., 2 ms) in response to an FTD event. Also, the continuous power mode can be forced for a time interval (e.g., 150 ms) during soft start or a UVLO event.

In some example embodiments, the mode selection scheme uses a light load threshold detection scheme with Iq below 1 nA at no load. In some examples, the mode selection scheme includes saturation operation of a replica power FET in or out of dropout by modulating the reference voltage to VREF_scale=VIN minus an offset when VIN is less than a VOUT target in a light load condition. In some examples, a duty cycled replica load current is converted to voltage on a trimmed resistor and is compared with a high gain clocked comparator. One of the benefits of the proposed mode selection scheme is that it can be resistant to toggle. In some examples, an accurate trigger and accurate hysteresis across process, voltage, temperature (PVT), Iload, VIN, and CLOAD can achieved which helps prevent toggling. In some examples, the mode selection scheme may not change the biasing/gain of the error amplifier loop, so mode toggling due to VOUT offset error is unlikely with proper low noise sample/hold operations.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

The above discussion is meant to be illustrative of the principles and various embodiments of the present invention. Numerous variations and modifications will become apparent to those skilled in the art once the above disclosure is fully appreciated.

What is claimed is:

1. A system, comprising:
a linear regulator adapted to be coupled to an input voltage source, the linear regulator including:
an output adapted to be coupled to a load;
a switch with a first current terminal coupled to the input voltage source and with a second current terminal coupled to an output node;
an error amplifier coupled to a control terminal of the switch; and
a control circuit coupled to the error amplifier and configured to provide a reference voltage to the error amplifier, the control circuit includes a mode selection circuit with a slow loop configured to sample a load current and with a fast loop configured to detect an output voltage error signal; and
wherein the mode selection circuit is configured to adjust a mode of the control circuit between a continuous power mode and a duty cycle power save mode based on the sampled load current and the output voltage error signal.

2. The system of claim 1, wherein the slow loop is configured to operate at two different rates.

3. The system of claim 1, wherein the mode selection circuit is configured to select the continuous power mode for a fixed time interval in response to a rising edge of the output voltage error signal.

4. The system of claim 1, wherein the mode selection circuit is configured to force the continuous power mode for a fixed time interval during startup or after an undervoltage condition.

5. The system of claim 1, wherein the mode selection circuit is configured to switch the linear regulator from the continuous power mode to the duty cycle power save mode within a first interval, and wherein the mode selection circuit is configured to switch the linear regulator from the duty cycle power save mode to the continuous power mode within a second interval that is longer than the first interval.

6. The system of claim 1, wherein the fast loop is configured to override the slow loop in response to the output voltage error signal being greater than a threshold.

7. The system of claim 1, wherein the mode selection circuit comprises a replica power FET and the mode selection circuit is configured to convert a duty-cycled replica load current to a voltage and to compare the voltage with a reference of a clocked comparator.

8. The system of claim 7, wherein the switch is a power transistor with a first current terminal coupled to a supply voltage node, with a second current terminal coupled to an output node of the linear regulator, and with a control terminal coupled to an output of the error amplifier, and wherein the replica power FET has a first current terminal coupled to the supply voltage node, a second current terminal coupled to a sample-and-hold circuit, and a control terminal coupled to the output of the error amplifier.

9. The system of claim 1, wherein the control circuit has a quiescent current less than 1 nA in a no load state.

10. The system of claim 1, wherein the linear regulator comprises a set of clocked components including a portion of the mode selection circuit, a sample-and-hold bandgap circuit, a scaling amplifier, and a reference current circuit.

11. The system of claim 1, wherein the linear regulator comprises a set of continuously on components including an error amplifier, wherein one of the stages of the error amplifier is used to provide the output voltage error signal.

12. The system of claim 1, wherein the linear regulator comprises a set of gated components that are turned on and off based on use of the continuous power mode and the duty cycle power save mode, wherein the set of gated components include a current limiter bias circuit, a thermal limit circuit, and a sample/hold gate bias circuit.

13. A linear regulator circuit having an output, comprising:
a switch with a first current terminal coupled to the input voltage source and with a second current terminal coupled to the output of the linear regulator circuit;
an error amplifier coupled to a control terminal of the switch;
a control circuit coupled to the error amplifier and includes a reference voltage circuit to provide a reference voltage to the error amplifier, wherein the control circuit includes a mode selection circuit with a slow loop configured to sample a load current and with a fast loop configured to detect output voltage error; and
wherein the mode selection circuit is configured to adjust a mode of the reference voltage circuit between a continuous power mode and a duty cycle power save mode based on the sampled load current and the output voltage error.

14. The linear regulator circuit of claim 13, wherein the reference voltage circuit comprises a set of clocked components including a sample-and-hold bandgap circuit, a scaling amplifier, and a reference current circuit.

15. The linear regulator circuit of claim 13, wherein the error amplifier stays on during the continuous power mode and the duty cycle power save mode.

16. The linear regulator circuit of claim 13, wherein the linear regulator comprises an auxiliary circuit coupled to an output of the error amplifier, wherein the auxiliary circuit comprises a set of gated components that are turned on and off based on use of the continuous power mode and the duty cycle power save mode, wherein the set of gated components include a current limiter bias circuit, a thermal limit circuit, and a sample/hold gate bias circuit.

17. An electronic device comprising:
a linear regulator device, including:
an input voltage node adapted to be coupled to a battery;
an output voltage node;
a regulation circuit between the input voltage node and the output voltage node;
an error amplifier coupled to a control terminal of the regulation circuit, wherein the output voltage node is coupled to a first input of the error amplifier; and
a control circuit coupled to a second input of the error amplifier, wherein a reference voltage mode of the control circuit is controlled using a slow loop with a sample-and-hold circuit and using a fast loop with a comparator.

18. The electronic device of claim 17, wherein the slow loop comprises:
a first power transistor with a first current terminal coupled to the input voltage node, with a second current terminal coupled to the output voltage node, and with a control terminal coupled to an output of the error amplifier; and
a second power transistor with a first current terminal coupled to the input voltage node, with a second current terminal coupled to a sample-and-hold circuit, and with a control terminal coupled to the output of the error amplifier, wherein the sample-and-hold circuit is configured to sample a load current replica at the second current terminal of the second power transistor.

19. The electronic device of claim 17, wherein the fast loop includes a stage of the error amplifier configured to output an output voltage error signal to a switched comparator.

20. The electronic device of claim 19, wherein the control circuit includes a mode selection circuit with a continuous power mode and a duty cycle power save mode, wherein the duty cycle power save mode causes the control circuit to:

shut off of a current limit circuit;
duty-cycle an undervoltage detection circuit;
selectively duty-cycle and sample-hold a bandgap circuit;
selectively duty-cycle and sample-hold a scaling amplifier;
shutoff a thermal shutdown circuit; and
selectively duty-cycle and sample-hold a reference current circuit.

* * * * *